United States Patent [19]

Haacke et al.

[11] Patent Number: 4,973,111
[45] Date of Patent: Nov. 27, 1990

[54] PARAMETRIC IMAGE RECONSTRUCTION USING A HIGH-RESOLUTION, HIGH SIGNAL-TO-NOISE TECHNIQUE

[75] Inventors: E. Mark Haacke, University Heights; Zhi-pei Liang, Cleveland, both of Ohio

[73] Assignee: Case Western Reserve University, Cleveland, Ohio

[21] Appl. No.: 496,046

[22] Filed: Mar. 16, 1990

Related U.S. Application Data

[63] Continuation of Ser. No. 244,142, Sep. 14, 1988, abandoned, which is a continuation-in-part of Ser. No. 193,418, May 12, 1988.

[51] Int. Cl.$^5$ ............................................. G01R 33/20
[52] U.S. Cl. ................................................... 324/309
[58] Field of Search ............... 324/300, 307, 309, 310, 324/312; 364/724; 382/10, 22, 43

[56] References Cited

U.S. PATENT DOCUMENTS

| | | | |
|---|---|---|---|
| 4,411,270 | 10/1983 | Damadian | 324/309 |
| 4,678,996 | 7/1987 | Haacke et al. | 324/309 |
| 4,703,349 | 10/1987 | Bernstein | 358/133 |
| 4,716,368 | 12/1987 | Haacke | 324/309 |
| 4,716,414 | 12/1987 | Luttrell et al. | 342/179 |
| 4,724,386 | 2/1988 | Haacke et al. | 324/309 |

FOREIGN PATENT DOCUMENTS 2144251A 2/1985 United Kingdom .................. 382/10

OTHER PUBLICATIONS

Bergland G. D., "A Guided Tour of the Fast Fourier Transform", IEEE Spectrum, Jul. 1969, pp. 41–52.
Bertero, M. et al., "Resolution in Diffraction-Limited Imaging, a Singular Value Analysis", The Case of Coherent Illumination, Optica Acta 1982, vol. 29, No. 6, 727–746.
Gershberg, R. W., "Super-Resolution Through Error Energy Reduction", Optica Acta 1974, vol. 21, No. 9, pp. 709–720.
Haacke et al., Superresolution Reconstruction Through Object Modeling and Parameter Estimation, IEEE Transactions on Acoustics, Speech, and Signal Processing, vol. 37, No. 4, Apr. 1989.
Haacke, Image Behavior: Resolution, Signal-to-Noise, Contrast, and Artifacts, Ch. 1, *MRI of the Spine*, Yearbook Medical Publishing, 1988.

*Primary Examiner*—Michael J. Tokar
*Attorney, Agent, or Firm*—Renner, Otto, Boisselle & Sklar

[57] ABSTRACT

An imaging apparatus and method which provides for reconstruction of images from sampled data with improved resolution, improved signal-to-noise, optimal edge detection, and pattern recognition. The apparatus and method are characterized by the use of a priori information (constraints) and a high pass filter on the data to obtain superresolution reconstruction of image data. An object function is approximated by a series of known model functions such as box car and polynomial functions. Solution of the object function depends on a finite number of unknowns whereupon the model parameters can be perfectly resolved to obtain infinite or superresolution. The apparatus and method have particular application in nuclear magnetic resonance imaging as well as other imaging modalities.

39 Claims, 15 Drawing Sheets

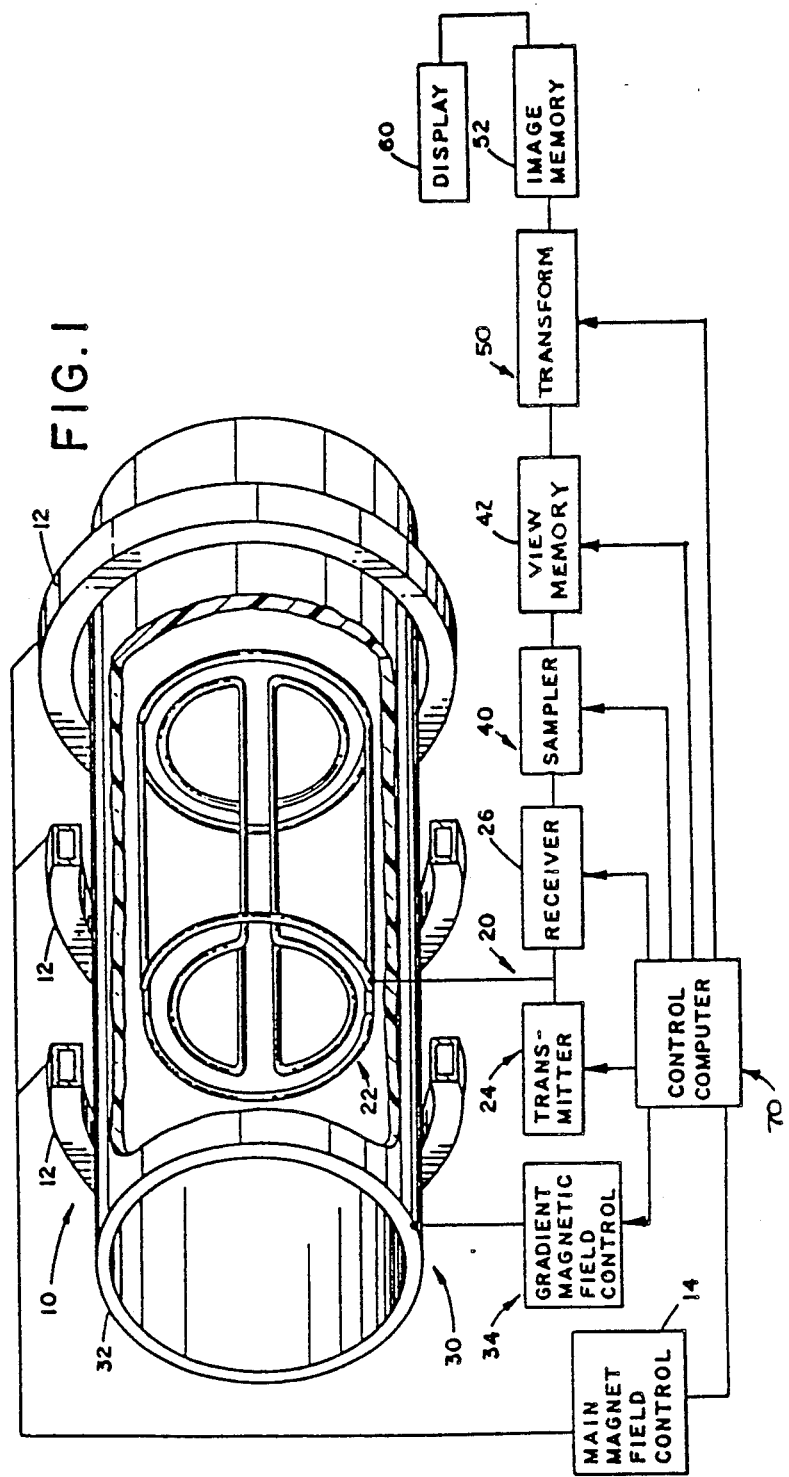

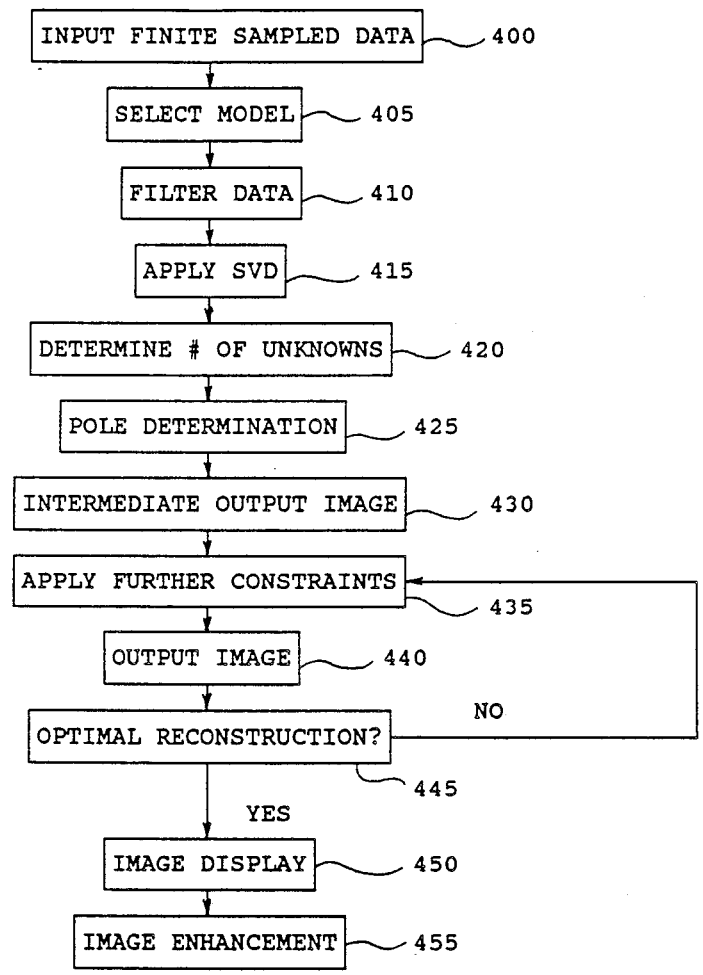
FIGURE_2A

PARAMETRIC IMAGE RECONSTRUCTION USING A HIGH-RESOLUTION, HIGH SIGNAL-TO-NOISE TECHNIQUE

RELATED APPLICATION DATA

This application is a continuation of copending application Ser. No. 244,142, filed Sept. 14, 1988 now abandoned, which is a continuation-in-part of copending allowed application Ser. No. 193,418, filed May 12, 1988, which is hereby incorporated herein by reference.

The invention herein described relates generally to the art of image reconstruction. The invention finds particular application in the reconstruction of magnetic resonance images and will be described with particular reference thereto. However, the invention is also applicable to other imaging modalities including computerized tomography, digital x-ray, optics, ultrasonics, geophysics, and the like.

BACKGROUND

In magnetic resonance imaging, the object of interest is positioned in an image region through which passes a strong, substantially uniform, longitudinal magnetic field. Magnetic dipoles of nuclei disposed within the imaging region would then tend to align with the strong magnetic field. Resonance excitation frequency pulses are applied to the image region to place magnetization from the magnetic dipoles into the traverse plane where they continue to precess about the strong magnetic field. As the magnetic dipoles precess, corresponding radio frequency resonance signals are generated.

Various techniques, which are well known in the art, may be implemented to excite resonance and spatially encode the resonance signals. These techniques are accomplished by applying gradient magnetic fields in one, two and/or three directions. In one technique, orthogonal magnetic field gradients are applied to encode spatial position into a selected slice or planar region of interest. The magnetic field gradients are encoded along one axis giving a frequency which varies linearly in accordance with position and along an orthogonal axis or axes giving a phase that varies linearly in accordance with position. Accordingly, the spatial encoding is carried by the frequency and phase of the resonance signal. The resonance signal is collected for each of a plurality of phase encodings and transformed from a frequency and phase domain to an image or spatial domain. In the image domain, each transformed resonance signal (after the transforms along the phase encoding directions) produces a view representing a combination of the density and relaxation times (herein the dependence of the image on density and relaxation times are conjunctively termed spin density) of resonating nuclei in each pixel or voxel of the image region. The accuracy with which an image can be reconstructed following this technique generally is limited by the number of phase and frequency encoding steps, i.e., the number of collected views or sampled points.

In general, regardless of the particular technique applied to acquire the data, the acquisition of the data takes time. Usually a first spatial direction, referred to as the read direction, is collected very quickly. The second spatial direction, referred to as the phase encoding direction, often takes a much longer time to acquire. Still additional time is needed should data be phase encoded in a third or slice select direction. In any case, due to time considerations, it is not always possible to collect a sufficient number of data points to acquire a desired resolution applying known techniques for mapping the data in the frequency and phase domain to the image or spatial domain. Also, signal-to-noise is often poor when high resolution is desired.

Heretofore, standard Fourier transform imaging techniques have been used to reconstruct the discretely sampled data to produce an image. The usual Fourier transform technique suffers seriously from truncated data because of ringing, i.e., the Gibbs phenomena. Similar difficulties occur with the generalized transform when the pixel sizes are not chosen correctly or when a continuous object is imaged. In general, the conventional Fourier analysis with a limited number of sampled points is subject to limited resolution and poor signal-to-noise, and these drawbacks are rendered more severe in the case of objects with sharp edges.

SUMMARY OF THE INVENTION

The present invention provides an imaging apparatus and method which provides for reconstruction of images from sampled data with improved resolution. The apparatus and method are characterized by the use of a priori information (constraints) to obtain superresolution reconstruction of image data. The apparatus and method use a priori knowledge that objects of general interest are not only of finite spatial support but can usually be modelled by a series of box car functions or other functions defined by a finite and preferably small number of parameters. That is, the object function is approximated by a series of known model functions such as box car functions. Solution of the object function then depends on a finite number of unknowns whereupon the model parameters can be perfectly resolved to obtain infinite or superresolution. Accordingly, the apparatus and method deal with the object shape as it presents itself in the data domain, this being in contrast to prior techniques which attempted to determine object shape from the image domain. The preferred imaging apparatus and method may also be characterized by improvement of signal-to-noise over conventional Fourier analysis.

The invention has particular application in nuclear magnetic resonance imaging. Magnetic resonance imaging can be practiced in accordance with the invention with the collection of fewer views or sampled points than prior art procedures while still obtaining comparable or superior image quality. This desirably reduces the time required to acquire sufficient data for acceptable image reconstruction. For example, the number of views may be reduced by one-half or even one-quarter while still providing acceptable image quality, thereby reducing examination time in half or by one-quarter. As the number of parameters characterizing the object is reduced so can the necessary imaging time be reduced.

According to one aspect of the invention, there is provided a method of processing image reconstruction data. The method comprises the steps of acquiring discretely sampled object data for the first space, and transforming the first space data into a second space using an inverse formalism into which a model of the object is absorbed. Further steps include high-pass filtering the data to find image edges, and fitting models within the edge regions.

According to a more limited aspect of the invention, magnetic resonance imaging of an object is performed using scan data obtained with a nuclear magnetic resonance scanner. Image reconstruction comprises the steps of acquiring NMR scan data of an object, transforming the scan data from data space to image space using an inverse formalism into which a given model of the object is incorporated, and displaying the image in manreadable form. The said model can be a step function or polynomial function, and can even be a non-polynomial function. The transform step and steps for solving the object function includes using least squares fitting and singular value decomposition techniques.

According to another aspect of the invention, there is provided an imaging apparatus for reconstructing an image from Fourier transform data comprising acquisition means for sampling Fourier transform image data in at least one dimension, and transform means for reconstructing from the data model objects having a shape fitting the modeled region.

According to still another aspect of the invention, imaging apparatus for reconstructing an image from scan data obtained with an NMR scanner comprises acquisition means for acquiring nuclear magnetic resonance scan data of an object, transform means using at least one known shape having variable center, duration, and amplitude as a constraint for reconstructing the image from the scan data, and display means for displaying the reconstructed image in man-readable form.

The foregoing and other features of the invention are hereinafter more fully described and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

In the annexed drawings:

FIG. 1 is a diagrammatic illustration of a magnetic resonance imaging apparatus in accordance with the present invention;

FIGS. 2A and 2B are flow diagrams of methods to reconstruct and visually display images in accordance with the present invention;

DETAILED DESCRIPTION

Figure 2B:
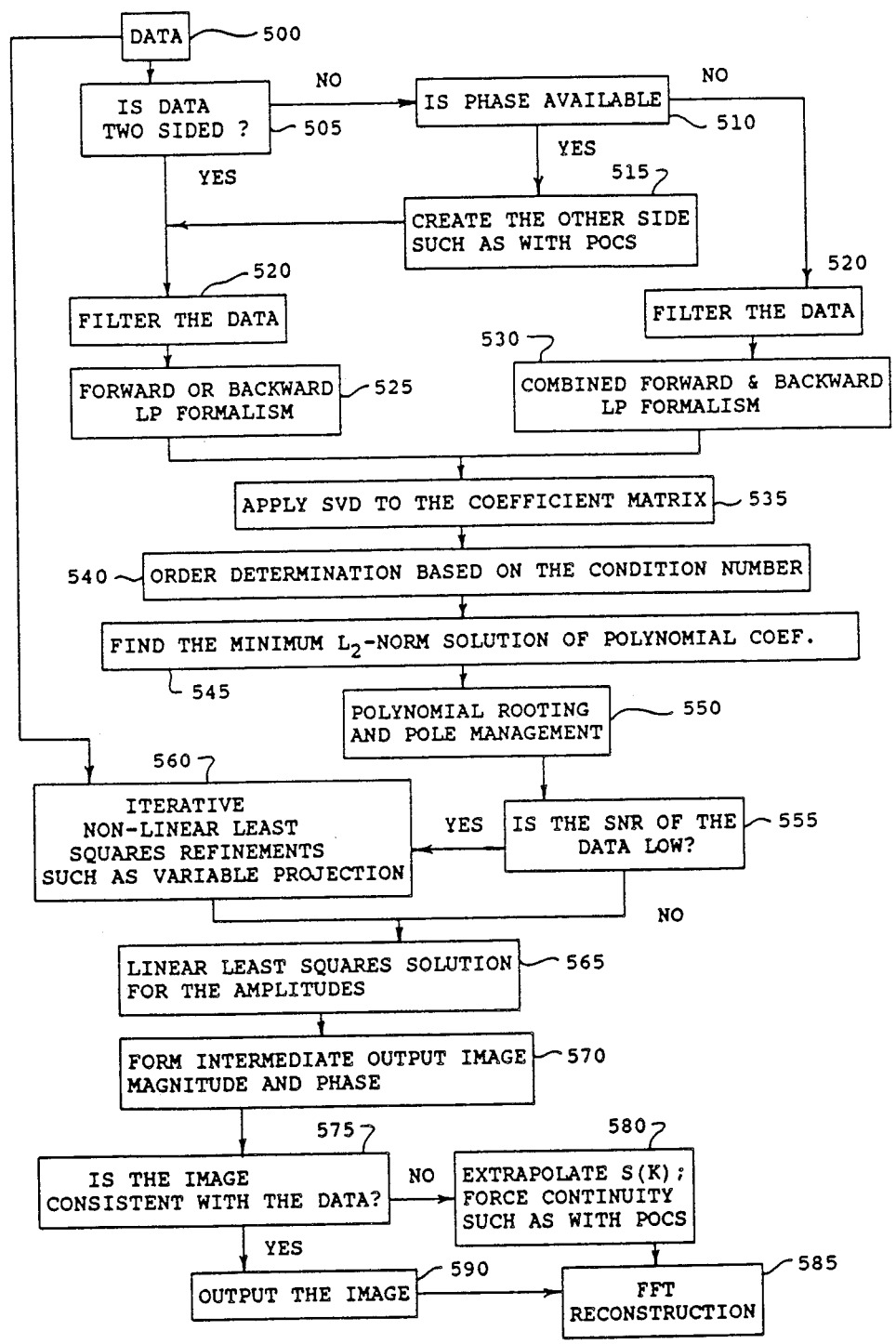

With reference to FIG. 1, a magnetic resonance scan unit can be seen to include a main magnetic field generating means 10 for generating a strong, main magnetic field which extends generally linearly through an image region. A resonance excitation means 20 selectively excites precession of magnetic dipoles of nuclei in the image region about the main magnetic field. Each precessing magnetic dipole generates a component of a resonance signal. A gradient field means 30 selectively causes gradients across the main magnetic field in the image region at selectable orientations. The gradient magnetic fields spatially encode the resonance signal components transmitted by resonating magnetic dipoles within the image region. Specific to the preferred embodiment, the frequency and relative phase of each component is encoded in accordance with the spatial location of the corresponding generating dipole.

A sampling means 40 discretely samples and stores an integral number of data points of each received resonance signal. A transform means 50 transforms or maps the resonance signal data points from data space or the phase/frequency domain to image space or spatial domain. The reconstructed image representation of each view is stored in an image memory means 52 for display on a video monitor or other man-readable display 60, recording on tape or disc for later use or processing, or the like. In the preferred embodiment, the display provides an indication of the density and relaxation times of the precessing magnetic dipoles at a given position. Other information such as relaxation times, chemical compositon, bonding, the physical state of nuclei whose dipoles are precessing, and the like may also be extracted from the resonance signals. A computer control means 70 controls and coordinates operation of the magnetic field and gradient control means, the resonance excitation means, the sampling and transform means, and the display means. In the preferred embodiment significant portions of all of these means are incorporated in the software of a common computer.

The main magnetic field generating means 10 includes a plurality of annular superconducting magnetics or fluid cooled, high power magnets 12 for generating the main magnetic field generally axially therethrough. A main magnetic field control circuit 14 controls and applies appropriate electric power to the annular magnets such that a substantially uniform and constant magnetic field is generated longitudinally therethrough.

The excitation means 20 includes a coil 22 which is connected with a radio frequency transmitter 24 for broadcasting radio frequency excitation pulses. The radio frequency pulses are of the appropriate timing and duration, as is known in the art, to cause precession of the magnetic dipoles away from the main magnetic field. The coil 22 functions between excitation pulses as an antenna for a radio frequency receiver 26. The receiver 26 receives the analog resonance signal which includes a large multiplicity of superimposed resonance signal components. The frequency and relative phase of the components are indicative of the encoded spatial position of each generating nucleus.

The gradient field means 30 includes gradient field coils 32 which surround the imaging region for selectively applying gradient magnetic fields across the main magnetic field. A gradient magnetic field control circuit 34 controls the angular orientation with which gradient fields are applied and the relative timing between the application of orthogonal gradient field pulses to control and select a phase encoding or frequency of the resonance signal components. The exact sequence and timing between resonance exciting transmission and application of the gradient fields will vary in accordance with the imaging sequence selected.

The sampling means 40 discretely samples each received analog resonance signal to generate one view of digital data for storage in a view memory means 42. After each change in the gradient magnetic field, the received analog resonance signal is sampled again. Within each view, an integral number of data points of the received resonance signal are sampled. The sampling produces a series of one dimensional data lines of discrete, sampled values.

The transform means 50 transforms the frequency and phase encoded data lines from the spatial frequency domain to the image space or the spatial domain. As each data set is transformed, it is added to the spatial domain image data stored in an image memory 52. The compilation of the two dimensionally transformed data lines of all views produces an electronic representation of an image of the spatial position, density and relaxation times of the resonating nuclei.

The above described components, excepting the transform means 50, may all be of conventional type and operated in known manner. The transform means 50, however, is uniquely characterized by the use of a priori information to reconstruct an object of some known shape. As discussed in greater detail below, the transform means uses an inverse formalism into which a given model of the imaged object is incorporated to transform or map the discretely sampled data into the image space. That is, with modelling according to the invention, the object function is approximated by a series of known model functions such as box car functions. In essence, the transform technique according to the invention provides for superresolution and in theory infinite resolution with improved signal-to-noise because of the reduced number of parameters characterizing the model, i.e., assumed object shape.

As above indicated, the transform technique according to the subject invention uses a priori information to reconstruct an object of some known shape. That is, there can be chosen a basis set for the appropriate function space incorporating the known information (constraints) about the object function. For example, the objects may be modelled (constrained) by a finite set of step (box-car) functions. In this case the step functions serve as the basis and the sharp boundaries incorporated into the basis functions provide superresolution capabilities. The usual infinite number of degrees of freedom usually assumed with the standard Fourier transform technique have been collapsed to a finite number.

Other models/constraints may be used including lorentzians, circular profiles, ramps, truncated sine waves, or any other desired shape, where the number of parameters (unknowns) are limited by the model chosen. If the object function is characterized by only a finite number of unknowns, then only a finite number of data points are required to obtain an exact solution for the object function. In any case, the general procedures herein described with respect to box car functions are equally applicable to these other models. For general linear systems, an exact solution is possible. For non-linear systems, an iterative method is disclosed in copending application Ser. No. 193,418, field May 12, 1988, which is hereby incorporated herein by reference. However, according to the present invention, alternative methods may be employed as hereinafter described. Method 'A' demonstrates the solution for an object function consisting of one-dimensional step (box car) functions. Method 'B' demonstrates a suitable solution for an object function consisting of multi-dimensional model functions such as ramps, parabolas, etc. (Some aspects of this method are discussed in Liang, Haacke, et al, "High Resolution Spectral Estimation Through Localized Polynomial Approximation", presented at proceedings of IEEE-ASSP, 4th Workshop on Spectral Estimation and Modeling, pp. 402–407, Minneapolis, Minn., Aug. 3–5, 1988; which is hereby incorporated herein by reference.)

For example, for a two-dimensional image, the object profile to be reconstructed can be obtained from a two-dimensional data set which has sufficient points collected in one direction to allow an acceptable Fourier transform reconstruction in that direction. The remaining one-dimensional transform (for which there may be insufficient points collected for an acceptable Fourier transform reconstruction, as in the phase encoding direction) is accomplished using the methods described herein.

The functions of the transform means preferably are performed by programs and sub-routines of an appropriately programmed computer or processor. To provide for a more detailed understanding of the present invention and to assist in the programming of the appropriate sequence of steps when making and using the present invention, the following mathematical analysis and explanation is provided.

Method A: Box car constraint

For a one-dimensional imaging problem, the goal is to solve for the object function $\rho(x)$ from the following integral equation:

$$s(k) = \int_{-\infty}^{\infty} \rho(x) e^{-i2\pi kx} dx \tag{1}$$

where s(k) may represent the time or phase encoding domain. It is well known that, in general, information over an infinite frequency range is needed for a unique solution of $\rho(x)$, and it is given by the inverse Fourier transform as $$\rho(x) = \int_{-\infty}^{\infty} s(k) e^{i2\pi kx} dk. \tag{2}$$

This is commonly known as the Fourier transform reconstruction method. In practice, due to physical or time constraints, information over only a finite frequency range, $-W/2 \leq k \leq W/2$, is available, and the standard Fourier transform reconstruction method gives $$\hat{\rho}(x) = \int_{-\infty}^{\infty} \rho(\tau) H(x - \tau) d\tau, \tag{3}$$

where the convolution kernel is $H(x) = \sin(2\pi Wx)/2\pi x$, and W is usually called the aperture size in optics, or the data window size in signal processing. Due to this convolution effect, ringing is present in the image, and the resolution of $\hat{\rho}(x)$ is limited to $1/W$.

The present invention incorporates an object model based on a priori knowledge of the object function. Consequently, the information in the data is used much more efficiently than in the Fourier transform reconstruction, and many problems associated with the conventional Fourier transform technique are overcome. Moreover, both the signal-to-noise and resolution will be improved at the same time. In contrast, with the Fourier transform, image resolution and signal-to-noise are always in conflict, since as the number of data points increases, the signal energy per pixel is reduced accordingly.

In accordance with underlying principles of the invention, $\rho(x)$ can be taken to consist of a set of box car functions each with an unknown duration, center and amplitude. In this way, the sharp boundaries in the object, if there are any, can be easily incorporated into the model so that the dependence of recovering an artifact-free image on high frequency data can be dramatically relaxed. A smooth function can also be accurately reproduced based on a set of box car functions if the number of boxes used is big enough.

Therefore, a box car function model, even though simple and restrictive, is a desirable initial constraint to account for step changes in an object and to rebuild smooth changes as well.

With box car function modeling according to the invention, only the object function $\rho(x)$ is approximated by box car functions and, more importantly, the step size (the width of each individual box $\alpha$;) and the number of features are not fixed but optimally chosen for a particular application. Any curve can be fit reasonably well with a large number of appropriately chosen rectangles; correspondingly, the systematic error will be greatly reduced as compared to the well known discrete Fourier transform (DFT) method and thus superresolution is attained. By superresolution, it is meant that the distance between two edges is prefectly determined (in the case of no noise) and is not restricted by the pixel size ($\Delta x = 1/W$).

The possibility of attaining superresolution through box car function modeling is best illustrated with a simple example. Assume that an object consists of N box cars uniformly spaced throughout the image each with a width of $\Delta x'$ and each centered at $n\Delta x$, with n between $-N/2$ and $N/2-1$. Then the signal of Equation (1) after performing the integration over each box becomes $$s(k) = \sum_{n=-N/2}^{N/2-1} \rho_n \mathrm{sinc}(\pi k \Delta x') e^{-i2\pi k n \Delta x} \Delta x', \quad (4)$$

where the sinc function is defined as $\mathrm{sinc}(x) = \sin(x)/x$. In this ideal case, the amplitudes $\rho_n$'s will be exactly recovered provided that N points of s(k) are available.

To obtain data adaptivity and reduce systematic error, the parameters describing the box car functions, namely, the edge locations (which correspond to width and center) and the amplitude, are allowed to be variable.

Under this model, the object function $\rho(x)$ is $$\rho(x) = \sum_{n=1}^{M} \rho_n W_n(x), \quad (5)$$

with the unit-amplitude box car function $W_n(x)$ defined as $$W_n(x) = \begin{cases} 1, & \text{for } |x - \beta_n| \leq \alpha_n/2 \\ 0, & \text{otherwise} \end{cases} \quad (6)$$

where $\alpha_n$ and $\beta_n$ are the width and center of the box car function, respectively. Call $\rho = \{M, \alpha_n, \beta_n, \rho_n | 1 \leq n \leq M\}$ the model parameter set and M the model order. Substituting $\rho(x)$ into Equation (1) yields $$s(k) = \sum_{n=1}^{M} \rho_n \alpha_n \mathrm{sinc}(\pi \alpha_n k) e^{-i2\pi \beta_n k}. \quad (7)$$

If N points of s(k) are given at $k = l\Delta k$, for $l = -N/2, \ldots, N/2-1$, then it follows that $$s(l\Delta k) = \sum_{n=1}^{M} \rho_n \alpha_n \mathrm{sinc}(\pi \alpha_n l \Delta k) e^{-i2\pi \beta_n l \Delta k}. \quad (8)$$

Now, the reconstruction problem reduces to solving for the $\alpha_n$'s, $\beta_n$'s, and $\rho_n$'s.

Solving Equation (8) for $\alpha_n$, $\beta_n$ and $\rho_n$ is a highly non-linear problem. Usually a search technique is required to fit these model parameters to the data on a least squares basis. While many non-linear least squares techniques exist, equations of this kind are inherently difficult to solve. According to the subject invention, the non-linear equation, i.e., equation (8), is converted into an equation that is easy to solve.

The derivative of a box car function is a sum of two delta functions representing the two edges. Accordingly, equation (8) can be reduced to an all-pole model parameter estimation problem. By using a linear prediction formalism the nonlinear problem can be further reduced to solving for the roots of a characteristic polynomial, such as described in Makhoul, "Linear Prediction: A tutorial Review", *Proc. IEEE*, Vol. 63, pp. 561-580, 1975, and the application of ARMA as in Smith et al, "Application of Autoregressive Moving Average Parametric Modeling in Magnetic Resonance Image Reconstruction", *IEEE Trans. Med. Image.*, Vol. MI-5, pp. 132-139, 1986; both papers are hereby incorporated herein by reference.

The ARMA non-parametric linear prediction scheme can be used on the filtered data to extrapolate the data to obtain an image correct to within one pixel. Although there is a given model which will be correctly predicted with this approach, ARMA is unable to correctly predict the image in general. However, it is possible to use this image as an input to the iterative scheme described hereinafter with the addition of further constraints (see FIG. 2A, box 435).

Based on generalized function theory, the Fourier transform of the derivative of any generalized function in a suitably defined function space exists and is given by the Fourier transform of the generalized function itself multiplied by $+i2\pi k$. Based on this derivative property of the Fourier transform and Equations (1) and (5), the continuous signal s(k) is modified to $$\tilde{s}(k) = i2\pi k s(k) = \sum_{n=1}^{M'} \rho'_n e^{-i2\pi \beta'_n k}, \quad (9)$$

where $M' = M+1$, and $\rho'_n$ and $\beta'_n$ are the amplitude and the location of the new delta functions, respectively. With the set of $\beta'_n$ arranged in increasing order and by comparing Equation (7) with Equation (9), it is readily obtained that $$\beta_n = (\beta'_n + \beta'_{n+1})/2, \quad (10)$$

and $$\alpha_n = \beta'_{n+1} - \beta'_n \quad (11)$$

Thus, if $\beta'_n$ can be found via Equation (9), the non-linear parameters $\alpha_n$ and $\beta_n$ in Equation (7) will all be determined.

Given N points of $s(k)$ at $k=l\Delta k$, for $l=-N/2, \ldots, n/2-1$, solving for $\beta'_n$ from Equation (8) is a well known problem, see Prony, "Essai Experimentale et Analytique", *J. E. Polytech.*, Vol., pp. 24–76, 1795, and Marple, "Digital Spectral Analysis With Applications", Prentice-Hall (1987). If $s(k)$ is noiseless, it can proven that $z_n = \exp(-i2\pi\beta'_n\Delta k)$, for $n=1, \ldots, M'$, are exactly the $M'$ roots of the following polynomial equation:

$$g(M')Z^{M'} + g(M'-1)Z^{M'-1} + \ldots + g(1)Z + 1 = 0, \quad (12)$$

where the vector $G = (g(1), \ldots g(M'))^T$ with the superscript T denoting transpose is determined by the following linear prediction equations $$\begin{bmatrix} \tilde{s}(1) & \tilde{s}(2) & \ldots & \tilde{s}(M') \\ \tilde{s}(2) & \tilde{s}(3) & \ldots & \tilde{s}(M'+1) \\ \cdot & & & \cdot \\ \cdot & & & \cdot \\ \tilde{s}(N-M'-1) & & & \tilde{s}(N) \end{bmatrix} \begin{bmatrix} g(1) \\ g(2) \\ \cdot \\ \cdot \\ g(M') \end{bmatrix} = - \begin{bmatrix} \tilde{s}(0) \\ \tilde{s}(1) \\ \cdot \\ \cdot \\ \tilde{s}(N-M'-2) \end{bmatrix} \quad (13)$$

or $AG = S$. The matrix A is usually called the linear prediction (LP) data matrix. A shorthand notation $\hat{s}(l)$ has been used to represent $\hat{s}(l\Delta k)$ in the above equation and $S = -(\tilde{s}(0), \tilde{s}(1), \ldots, \tilde{s}(N-M'-2))^T$. In this linear prediction formalism, the minimum value for N (the number of data points) is $2M'$. Since the total number of unknowns is at least $2M'$ ($M'$ amplitudes and $M'$ edge locations). If $N > 2M'$, a least squares solution of G can be used. This approach, however, does not work well in general cases, since the matrix A is usually ill-conditioned. This is particularly true when the delta functions are very close together or when very narrow image features exist. Under these conditions, G will be very sensitive to noise present in the data.

This ill-conditioned problem is alleviated by using the following modifications (further reference may be had to R. Kumaresan and D. W. Tufts, "Estimating The Parameters Of Exponentially Damped Sinusoids And Pole-Zero Modeling In Noise", *IEEE Trans. Acoust., Speech, Signal Processing*, Vol. ASSP-6, pp. 833–840, 1982):

First, form the LP data matrix A in such a way so that the number of columns $L > M'$, preferably, $N/2 \leq L \leq 2N/3$ when $M' > N/2$. Second, approximate A by a lower-rank matrix $\tilde{A}$ with rank $M'$. Third, find the minimum $L^2$-norm (sum of the differences squared) solution of G.

Now, using singular value decomposition (SVD) on A, steps 2 and 3 can be easily accomplished. Let A be decomposed as $$A = U\Sigma V^H, \quad (14)$$

where U and V are unitary matrices, $\Sigma$ is a rectangular diagonal matrix of the same size as A with its diagonal entries $\lambda_l$'s being arranged in decreasing order, and $H$ denotes conjugate transpose. Setting $\lambda_l$ to 0 for $M'$, and renaming the modified as, then A is obtained from $$\tilde{A} = U\tilde{\Sigma}V^H, \quad (15)$$

and thus the minimum $L^2$-norm solution of G is $$\vec{G} = \sum_{l=1}^{M'} \lambda_l^{-1} [\vec{u}_l^H \vec{S}] \vec{v}_l, \quad (16)$$

where $\vec{u}_l$ and $\vec{v}_l$ are the $l^{th}$ column vectors of U and V, respectively.

Another desirable feature of invoking SVD is that, when $M'$ is not known, it can be chosen such that the condition number $\lambda_l/\lambda_{M'}$ is not too large, and thus the numerical stability of the problem is improved. More importantly, by keeping only the principal singular values $\lambda_l$'s, a significant amount of noise can be eliminated. This allows $\beta'_n$ to be very accurately determined even when the signal-to-noise ratio (SNR) is not very high. Using both forward and backward prediction, which forces $z_n$ to lie on the unit circle, will further improve the estimation of $\beta'_n$.

Now that $\beta'_n$ has been determined, $\alpha_n$ and $\beta_n$ can be calculated through Equations (10) and (11). The edge location information then allows the linear problem of Equation (8) to be solved for the model amplitude using the generalized transform matrix approach.

Knowing $\alpha_n$ and $\beta_n$, a linear least squares procedure is all that is needed to solve for $\rho_n$ from Equation (8), and thus the whole model parameter set can be recovered. Note that decoupling the determination of the location of the box edges from the amplitudes provides similar results to a global least-squares solution, provided that $M'$ was exactly determined, and the SNR is not too low.

Summarizing the discussions above, a box car function modelbased reconstruction technique according to the invention can be diagrammed as shown in FIG. 2A. The data is input (box 400) to the transform means 50 (FIG. 1), which may be in the form of a hardware reconstruction device; and a model is selected, for this case a box car function, (box 405) which is representative of the sampled data. The raw data is filtered (box 410) and an SVD (box 415) is applied to reduce noise and to determine the number of unknowns (box 420). The pole locations are determined and modified, or managed, to produce reasonable results for a given noise level present (box 425). The intermediate output image can then be viewed (box 430). After this step is complete, the data can have further constraints applied (box 435) if desired. These further constraints may include re-inversion to data space and replacement of those projected points actually collected with the experimental data or other constraints as discussed hereinbefore. The new image is then output (box 440) and reevaluated (box 445) to determine if further constraints should be applied. Additional constraints may be applied iteratively until an optimal image is reconstructed (boxes 435, 440, 445). This may be accomplished by a matrix inversion process, such as a variable projection technique. The image is then displayed (box 450) and can be manipulated for visual display and interpretation as desired (box 455). A detailed outline is given in FIG. 2B, which illustrates a more generalized approach.

In order to demonstrate the performance of the proposed method, results from simulated and real experimental data are shown in FIGS. 3-4. Test model objects were generated with selected features to emphasize the superresolution capability of the method from different perspectives, and real data from magnetic resonance experiments was used to test its general applicability.

In FIG. 3, the reconstruction results of a model object from FFT (Fast Fourier Transform) and the above described reconstruction method using 64 data points are illustrated. The model was built with several features in mind. First, the ability to reconstruct a high resolution image for a box of any amplitude and width. Second, the dependence of the amplitude of a narrow box of width less than Δx on its edge location estimation in the presence of noise. Third, the infinite resolution capability of edge detection is shown for a box greater than one pixel wide. Fourth, the ringing problem inherent to the FFT method is demonstrated by placing two boxes close together.

Figure 3A:
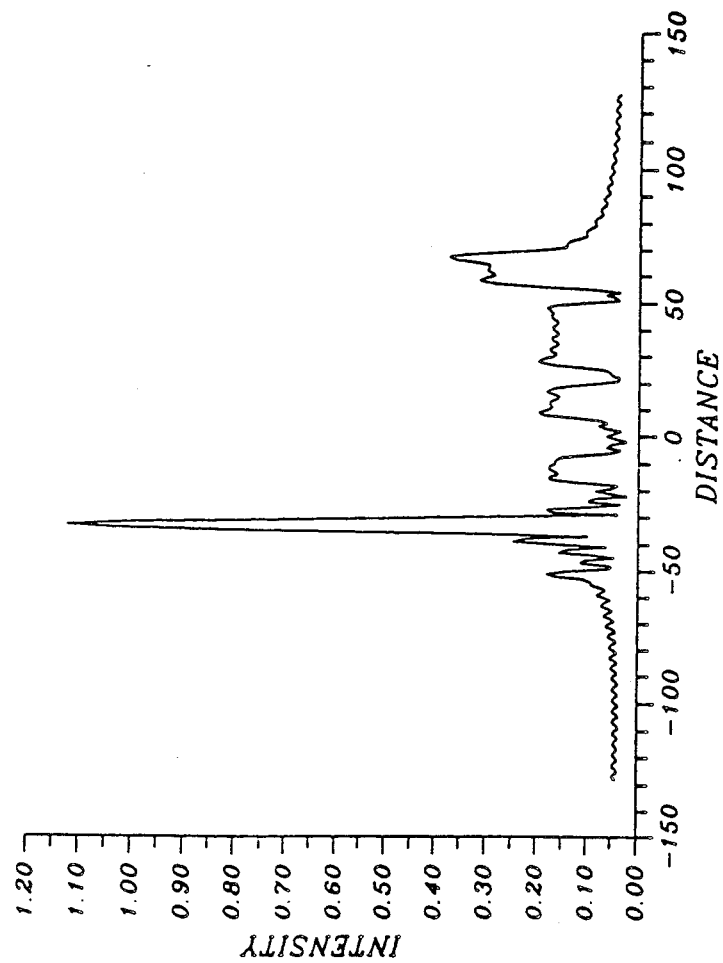
FIGS. 3A-3C are plots shwing a comparison between reconstructions of a box obtained by a conventional Fourier transform reconstruction method and by a reconstruction method according to the subject invention.
Figure 3B:
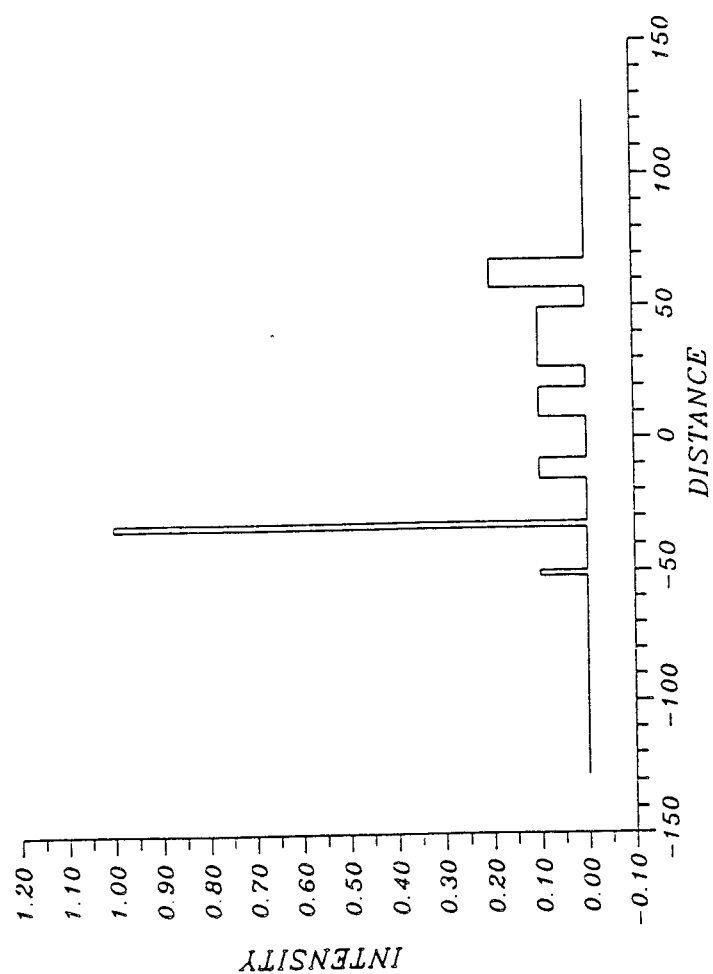
Figure 3C:
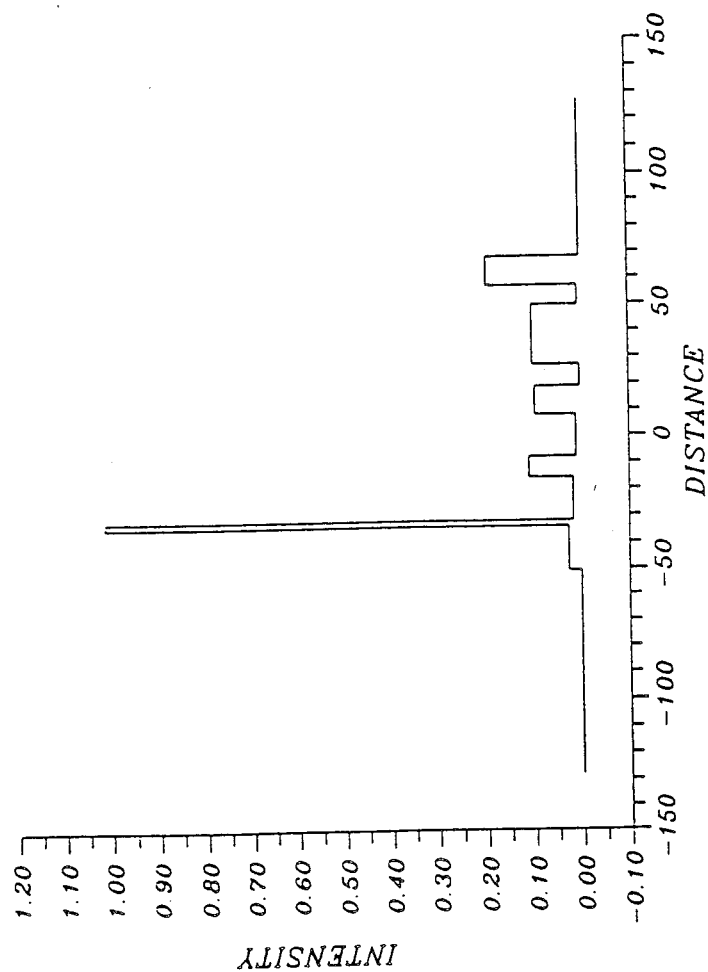
Figure 4A:
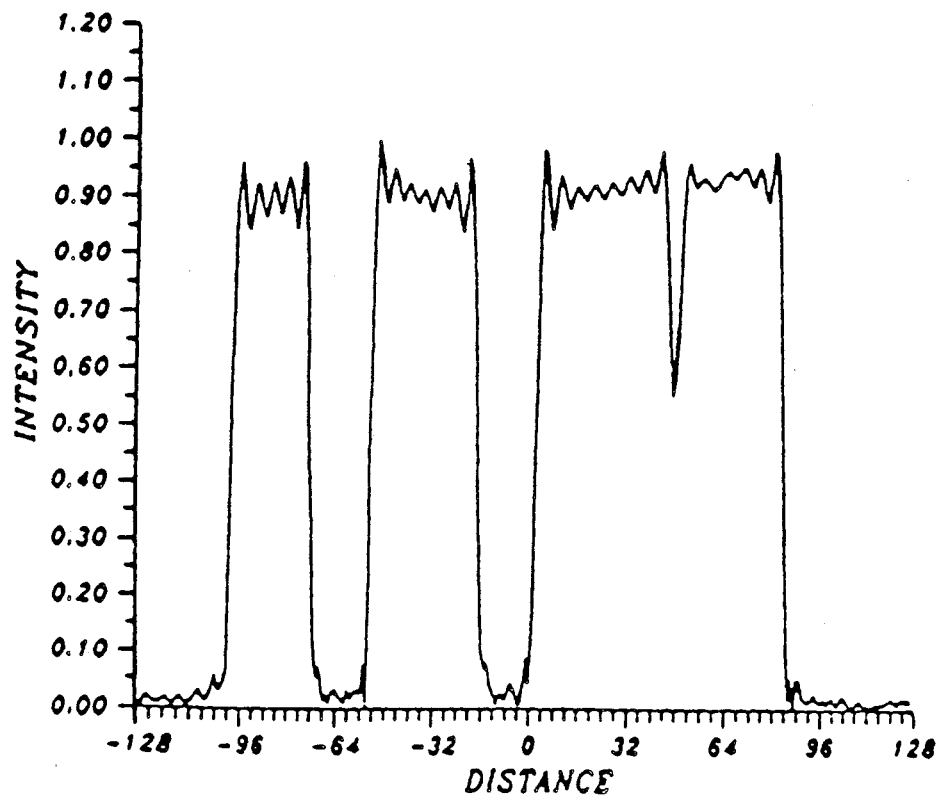
FIGS. 4A-4C show a series of profiles through a phantom using Fourier transform reconstructions and a 96 point constrained reconstruction.
Figure 4B:
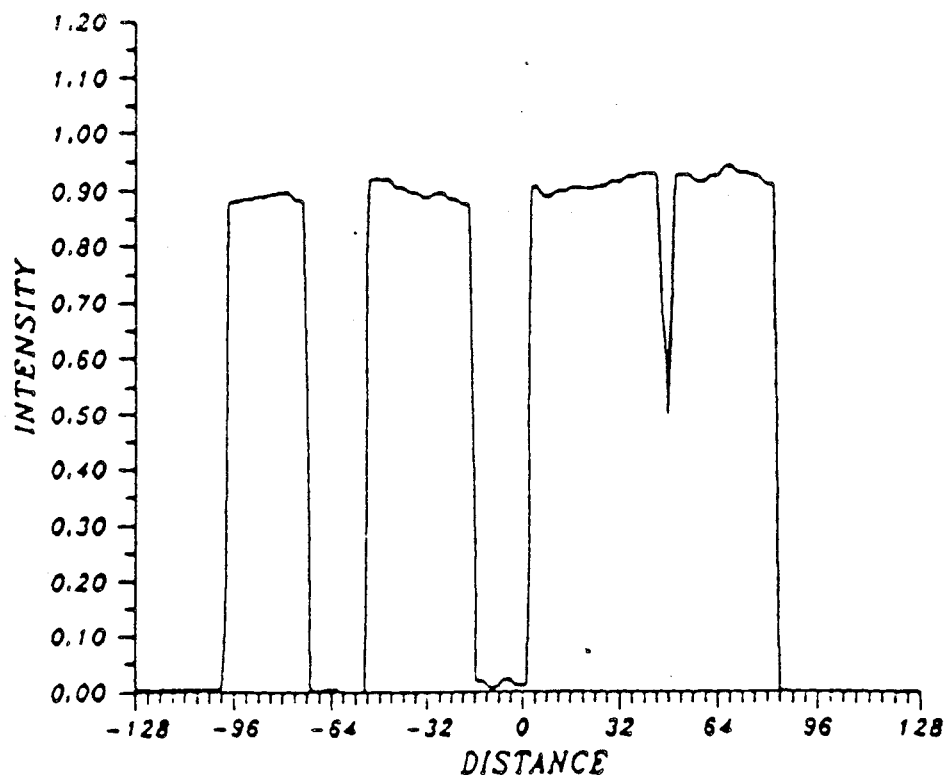

In the noiseless case, the object is reconstructed perfectly with constrained reconstruction in FIG. 3B, while the FFT reconstruction in FIG. 3A suffers significant ringing which renders the image useless for fine details. This demonstrates that, when the box car function model is adequate to describe the object, this method will be capable of unlimited resolution. In practice, noise plays a crucial role in evaluating the utility of this method. Based on this model, Monte-Carlo studies on the model parameter sensitivity (for amplitude, width and area) to Gaussian white noise perturbation were conducted. The exact values are shown in Table 1, while the results obtained from the data set with SNR=50:1 and 100 independent trials of noise are given in Table 2. It can be seen that this method is rather robust with respect to a reasonable SNR, which is due to the usage of SVD in $\alpha_n$ and $\beta_n$ estimation, and the least squares fitting procedure in the $\rho_n$ estimation. One can also notice that the higher energy box components are less vulnerable to noise perturbation, since they are associated with the most important principal singular vectors. This robust behavior bodes well for the application of this constrained reconstruction as a general inverse procedure to supplement or improve upon the inverse Fourier transform.

TABLE 1

| BOX | AMPLITUDE | WIDTH | AREA |
|---|---|---|---|
| 1 | 0.1 | 2.0 | 0.2 |
| 2 | 1.0 | 2.0 | 2.0 |
| 3 | 0.1 | 8.0 | 0.8 |
| 4 | 0.1 | 11.0 | 1.1 |
| 5 | 0.1 | 22.0 | 2.2 |
| 6 | 0.2 | 11.0 | 2.2 |

TABLE 2

| BOX | AMPLITUDE ($\mu \pm \sigma$) | WIDTH ($\mu \pm \sigma$) | AREA ($\mu \pm \sigma$) |
|---|---|---|---|
| 1 | 0.1108 ± 0.7921 | 2.1518 ± 0.8468 | 0.2021 ± 0.0074 |
| 2 | 1.0043 ± 0.0673 | 2.0018 ± 0.1403 | 2.0010 ± 0.0110 |
| 3 | 0.1000 ± 0.0010 | 7.9926 ± 0.1073 | 0.7992 ± 0.0089 |
| 4 | 0.1000 ± 0.0007 | 10.9965 ± 0.0765 | 1.0997 ± 0.0095 |
| 5 | 0.1001 ± 0.0006 | 21.9976 ± 0.0916 | 2.2023 ± 0.0131 |
| 6 | 0.2000 ± 0.0009 | 11.0033 ± 0.0421 | 2.1998 ± 0.0090 |

Besides random noise, systematic error may also arise in the usage of this modeling method. This could result, for example, from a false selection of the model order M (or M'). If M is underestimated, the LP data matrix in Equation (15) will be over truncated. In this example, there are 12 edges in this object, leading to 12 "nonzero" singular values in the SVD of the LP data matrix. If only 11 principal singular values and their associated singular vectors are used in the constrained reconstruction, FIG. 3C results. This systematic error leads to the loss of the box component with the lowest energy, and a false extended box containing the missing energy appears due to conservation of energy. However, the nature of these deviations tends to be local, which is a very powerful advantage.

Figure 4C:
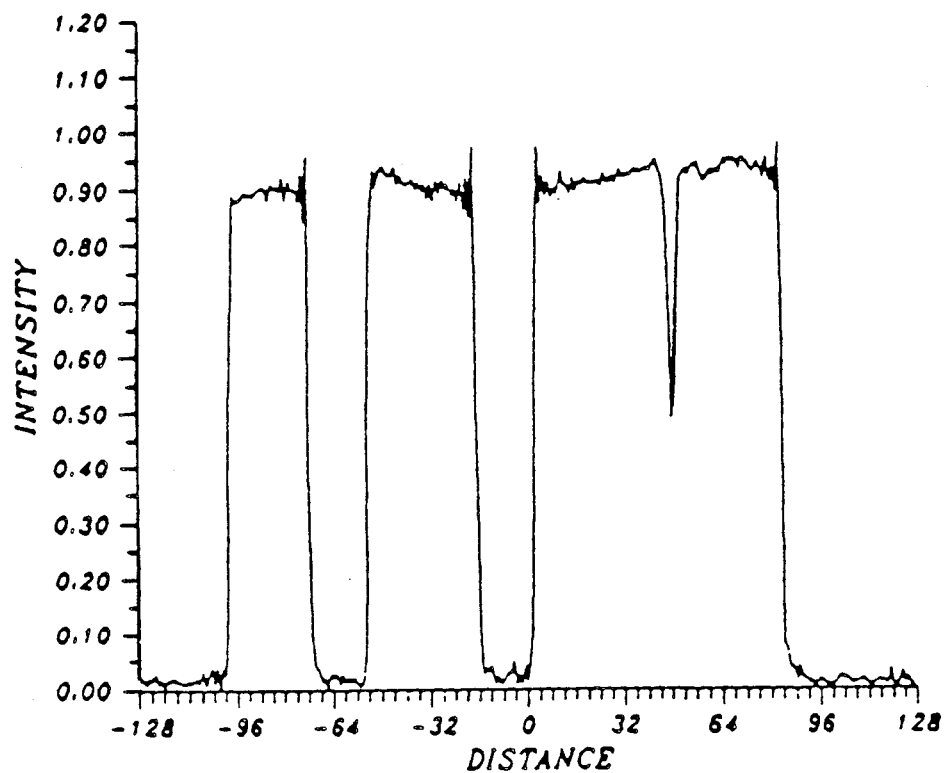

As a practical example, a real magnetic resonance phantom data set from an experiment performed on a Siemens Magnetom MR system has been tested. The SNR of the data in this case is 200:1. The phantom is first reconstructed in the vertical direction with an FFT of the 256 data points. Then, a 96 point FFT reconstruction is applied to the horizontal direction to obtain FIG. 4A, and a 96 point constrained reconstruction to obtain FIG. 4B. One can see that the image quality improvement of constrained reconstruction over the FFT method is dramatic, even when a 256 point FFT is used (FIG. 4C).

Figure 5:
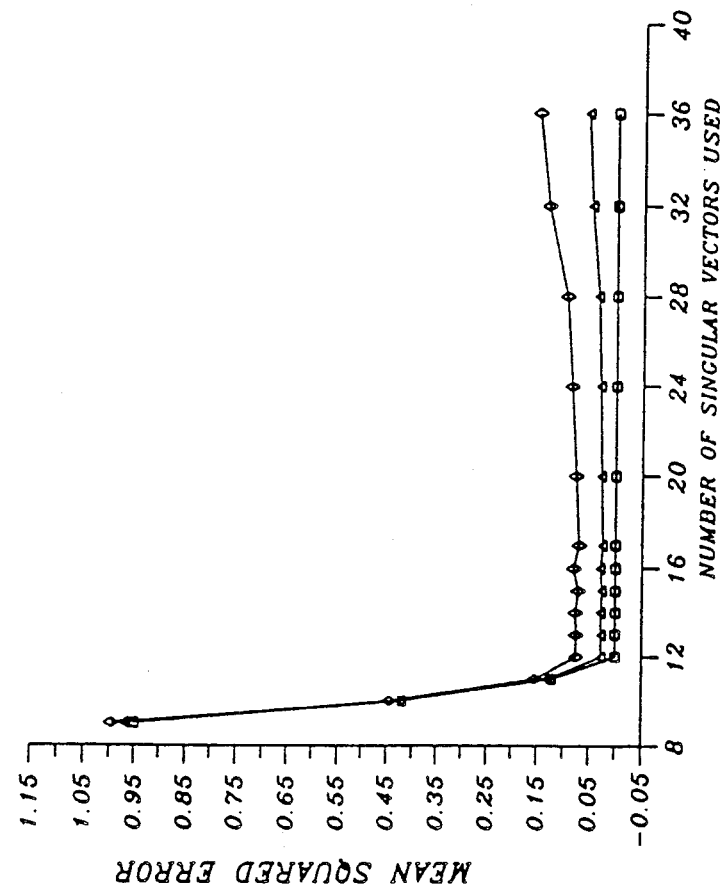
FIG. 5 is a plot of means squared error versus the number of eigenvalues retained.
Figure 6A:
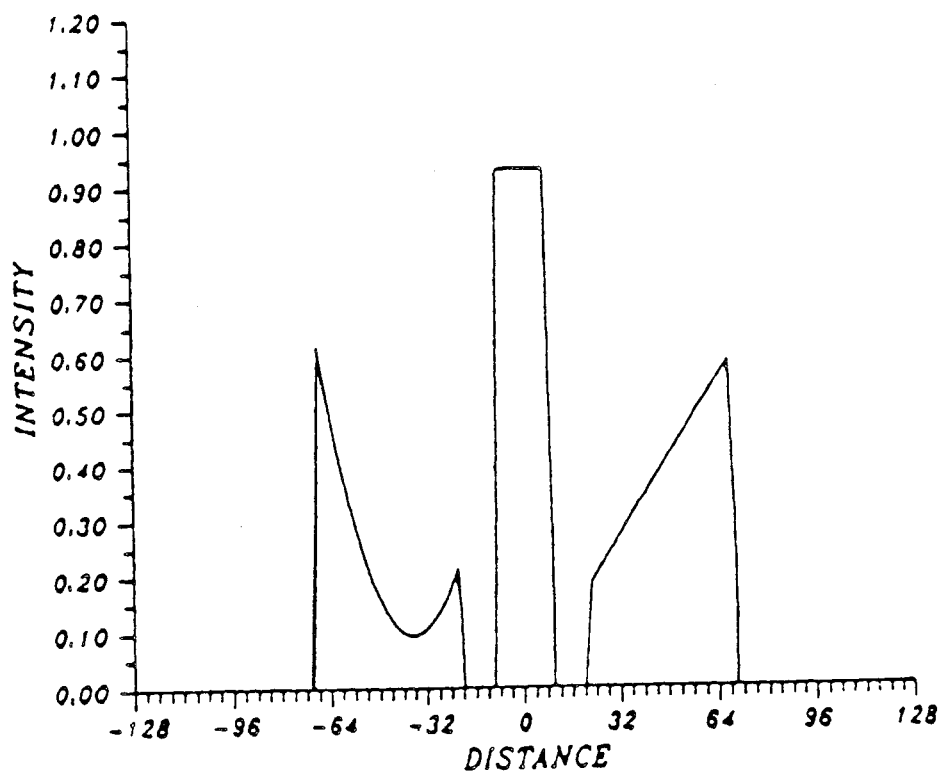
FIGS. 6A-6E show a series of shapes which can be automatically recognized in one or more dimensions in accordance with the present invention.
Figure 6B:
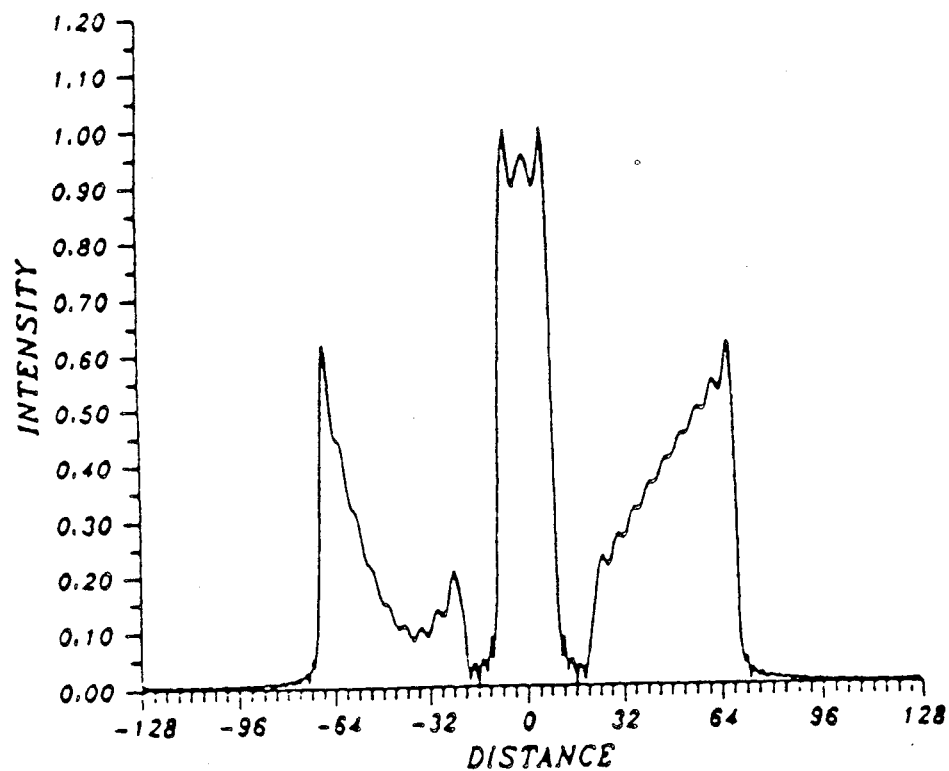
Figure 6C:
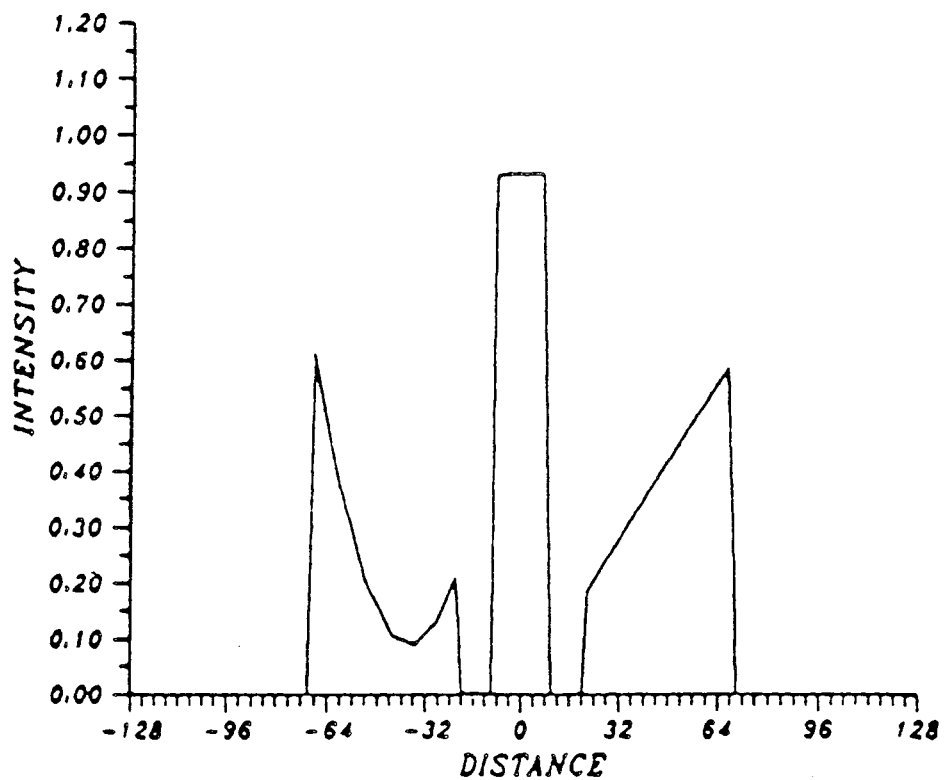
Figure 6D:
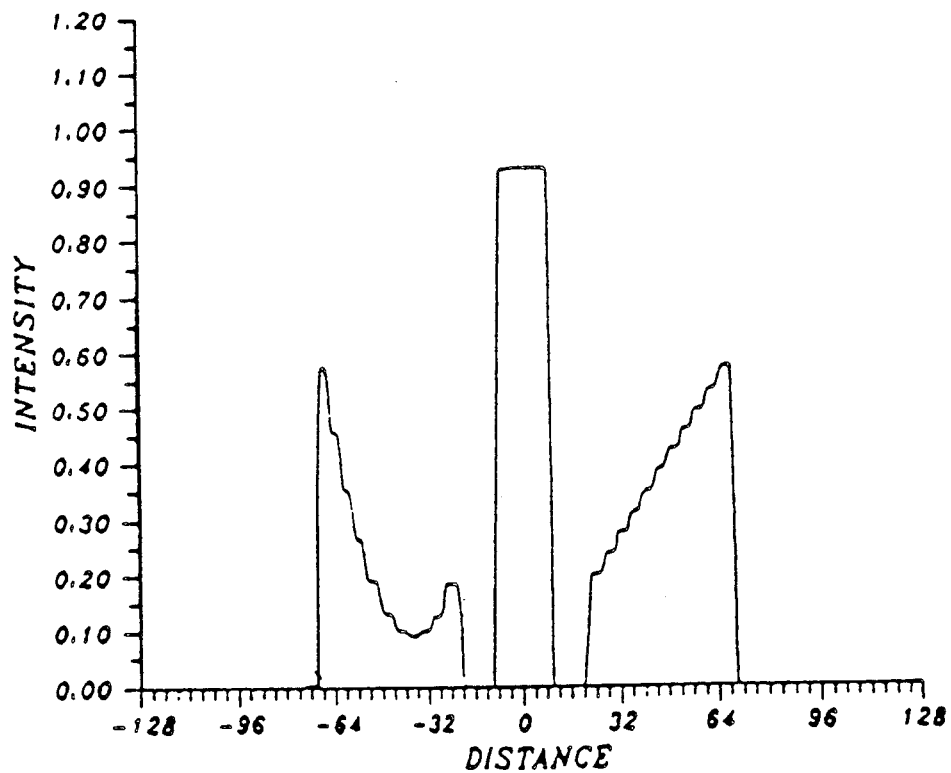
Figure 6E:
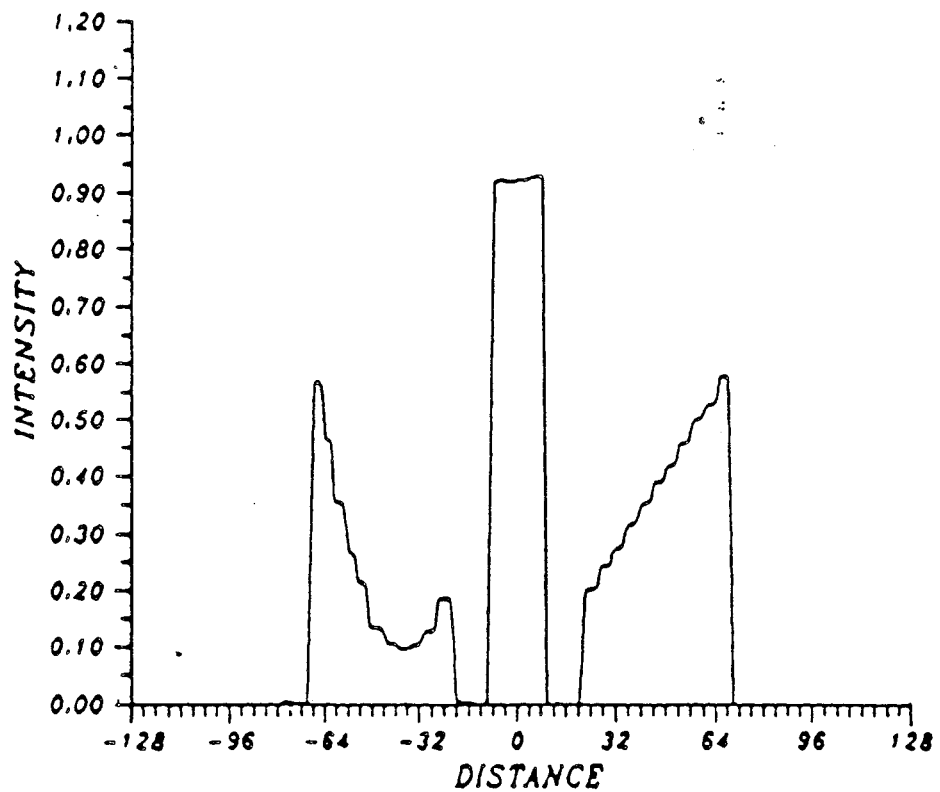

FIG. 5 shows the results of repeating the above example with several principal singular vectors being used, and calculating the mean squared difference between the constrained reconstruction and the model object. Clearly, the mean squared error is dramatic when too few singular vectors are used for the reconstruction. The slow rise past the order number, 12, suggests that keeping more singular vectors will be safer than keeping fewer. Of course, keeping too many terms also increases the noise effect, but it appears to rise very slowly as the number of singular vectors used increases. Usually, when the number of components is unknown, M' can be pre-determined using an order determination procedure. It can also be estimated based on the singular value distribution.

Method B: General Polynomial Constraint

The above approach can be generalized to include higher order terms in an expansion of ρ(f). For example, a piecewise smooth function can usually be approximated locally by a truncated Taylor series. If $\rho(f)$ is l-band-limited and continuous in each open interval $(a_l, a_{l+1})$, for l=1, 2, ..., M, within the bandwidth $|f| \leq 1$, then $\rho(f)$ can be reasonably modelled as a summation of local polynomials as $$\rho(f) = \sum_{l=1}^{M} \left\{ \sum_{k=0}^{P_l} C_{lk} f^k \right\} W_l(f), \quad (17)$$

where $P_l$ is the order of the $l^{th}$ local polynomial, $C_{lk}$ is the polynomial coefficient, and the window function $W_l(f)$ is defined as $$W_l(f) = \begin{cases} 1, & \text{for } a_l < f < a_{l+1} \\ 0, & \text{otherwise.} \end{cases} \quad (18)$$

As can be seen, this model parametrizes the edge locations to emphasize the piecewise continuous nature of ρ(f). In this way, when the model is fit to the experimental data, it will force the data to be used in such a way so that the sharp edges are best recovered. As a result, the Gibbs artifact originating from the sharp edges will be eliminated. This is very desirable, especially for medical imaging.

Under the model of Equation (17), the measured signal given in Equation (1) can be rewritten as $$s(t) = \sum_{l=1}^{M} \sum_{k=0}^{P_l} C_{lk} B_{lk}(t), \tag{19}$$

where the basis function is given by $$B_{lk}(t) = \int_{\alpha_l}^{\alpha_{l+1}} f^k e^{-i2\pi ft} df. \tag{20}$$

Given sampled points of $s(t)$ at $t=n\Delta t$, for $n=0, 1, \ldots, N$ we need to find $P_l$, $\alpha_l$, and $C_{lk}$, for $l=1, 2, \ldots, M$, and $k=1, 2, \ldots P$. If the $\alpha$'s and the P's are fixed, the model will become a linear one, and a linear least squares fitting procedure is all that is needed to solve for the C's. However, in practice, precise information of the P's and the $\alpha$'s is rarely known, and it is the freedom to allow them to vary that gives the model the desirable adaptivity to pick up sharp edges at arbitrary locations. In this case, the solution of the model parameters becomes a highly non-linear problem. In order to obtain uniqueness and stability of the solution, we need to restrict the total number of model parameters to be less than the number of data points available. The model parameters may then be solved using a least squares technique. While many iterative procedures exist for non-linear least squares data fitting, problems of this kind are very difficult to solve efficiently without a good initial estimate. As in the above described simple box car modeling case, one of the key contributions of this invention is the method of utilizing linear prediction theory to efficiently determine the parameters of a generalized all-pole parameter estimation problem.

A piecewise polynomial can be converted to a summation of Dirac delta functions and their derivatives through differentiation by one order larger than the maximum local polynomial order.

For the $\rho(f)$ given in Equation (19), it is easily shown that $$\rho^{(P)}(f) = \sum_{l=1}^{M+1} \sum_{k=0}^{K_l} a_{lk} \delta^{(k)}(f - \alpha_l) \tag{21}$$

where $P=\max(P_1, P_2 \ldots, P_M)+1$, $^{(P)}$ denotes the $p^{th}$ order derivative operator, and $a_{lk}$ is the amplitude parameter linearly dependent on the polynomial coefficients $C_{lk}$. The value of $K_l$ is dependent on the property of $\rho(f)$. If $\rho(f)$ is not continuous at $f=\alpha_l$, then $K_l=P-1$, otherwise, if $\rho(f)$ is continuous only up to and including the $L^{th}$ order derivative at this point, with $L \leq P-2$ and $P \geq 2$, then $K_l=P-L-2$.

Using the differentiation property of the Fourier transform, we find that the Fourier transform of $\rho^{(P)}(f)$ is $$(i2\pi t)^P s(t) = \sum_{l=1}^{M+1} \left( \sum_{k=0}^{K_l} a_{lk}(i2\pi t)^k \right) e^{-i2\pi \alpha_l t}. \tag{22}$$

Let $\tilde{s}(t)=(i2\pi t)^P s(t)$, $\tilde{a}_{lk}=(i2\pi\Delta t)^k a_{lk}$, $w_l=2\pi\alpha_l\Delta t$, and $\tilde{s}(n)$ denote $\tilde{s}(n\Delta t)$, Equation (22) can be written as $$\tilde{s}(n) = \sum_{l=1}^{M+1} \left( \sum_{k=0}^{K_l} \tilde{a}_{lk} n^k \right) e^{-i\omega_l n}. \tag{23}$$

(See FIG. 2B, step 520.) This result indicates that by simply multiplying the measured signal $s(t)$ with $(i2\pi t)^P$, the new signal thus obtained $\tilde{s}(t)$ is a summation of polynomial-weighted complex exponentials. This special structure of $\tilde{s}(t)$ leads to the following useful proposition.

Let A be the following Hankel matrix, usually called the backward linear prediction data matrix, $$A = \begin{bmatrix} \tilde{s}(0) & \tilde{s}(1) & \ldots & \tilde{s}(q) \\ \tilde{s}(1) & \tilde{s}(2) & \ldots & \tilde{s}(q+1) \\ \cdot & \cdot & & \cdot \\ \cdot & \cdot & & \cdot \\ \cdot & \cdot & & \cdot \\ \tilde{s}(N-q) & \tilde{s}(N-q+1) & \ldots & \tilde{s}(N) \end{bmatrix} \tag{24}$$

If $N-q \geq M+\Sigma_l K_l$, the row space of A, denoted as $R(A)$, is spanned by the following set of vectors $$\{ (1, e^{-i\omega l}, e^{-i\omega l2}, \ldots, e^{-i\omega lq}),$$
$$(0, e^{-i\omega l}, 2e^{-i\omega l2}, \ldots, q e^{-i\omega lq}),$$
$$\ldots$$
$$(0, e^{-i\omega l}, 2^{K_l}e^{-i\omega l2}, \ldots, q^{K_l}e^{-i\omega lq}) | l \in \Lambda \}$$

where $\Lambda = [1, M+1]$.

This set of vectors is linearly independent. Using Equation (23), it can be shown that any row of A can be expressed as a linear combination of this set of vectors. Therefore, they form a set of basis vectors for R (A). The following proposition easily follows from this property of matrix A.

If a coefficient vector $G=(g(0), g(1), \ldots, g(q))^t$ satisfies the homogeneous equation $AG=0$, with $q \geq M+1+\Sigma_l K_l$, then the polynomial equation defined by $$g(q)z^q + g(q-1)z^{q-1} + \ldots + g(0) = 0 \tag{25}$$

has zeros at $e^{-iwl}$ with multiplicity of $K_l+1$, for $l=1,2, \ldots, M+1$.

This can be verified by using the result from the previous proposition and the fact that G lies in the null space of A; hence, G is orthogonal to R (A).

In the case when $K_l=0, \forall l$, $s(n)$ in Equation (23) will become a summation of complex exponentials, and all the roots of Equation (25) are simple.

Considering the above, a method for solving the model parameters can be expressed as follows:

(a) Determination of the edge locations, $\alpha$'s:

Solution of this set of highly non-linear parameters is the most difficult step. The tactic described herein is to convert the original problem into an easy-to-solve one so that the non-linearity of the problem can be absorbed into a polynomial. Based on the above propositions, the method can be summarized as the following three-step procedure:

Step 1: High-pass filtering, $\tilde{s}(t)=(i2\pi t)^P s(t)$.

This step converts s(t) to a new linearly predictable signal $\tilde{s}(t)$ so that $\alpha$'s, the edge locations, can be extracted from the roots of the corresponding characteristic polynomial defined by this signal. P should be chosen to be $P_{max}+1$, where $P_{max}$ is the maximum local polynomial order allowed in the model. However, since this filter will amplify the high spatial frequency noise in s(t) dramatically, it is advised to choose P as small as possible. The usual tradeoff is between the amplification of random noise and the reduction of systematic modelling error. Our experience indicated that, if P is chosen to be 1, the proposed method can usually estimate the zero-order discontinuous points of $\rho(f)$ fairly accurately (within $1/N\Delta t$), when both random and systematic noise exist.

Step 2: Solving the linear equation, AG=0.

G defines a characteristic polynomial with its roots being directly related to the $\alpha$'s. If g(0) is constrained to be equal to 1, the polynomial roots remain the same and the homogeneous equation can be rewritten as $$\begin{bmatrix} \tilde{s}(1) & \ldots & \tilde{s}(q) \\ \tilde{s}(2) & \ldots & \tilde{s}(q+1) \\ \cdot & & \cdot \\ \cdot & & \cdot \\ \cdot & & \cdot \\ \tilde{s}(N-q) & \ldots & \tilde{s}(N) \end{bmatrix} \begin{bmatrix} g(1) \\ g(2) \\ \cdot \\ \cdot \\ \cdot \\ g(q) \end{bmatrix} = - \begin{bmatrix} \tilde{s}(0) \\ \tilde{s}(1) \\ \cdot \\ \cdot \\ \cdot \\ \tilde{s}(N-q-1) \end{bmatrix} \quad (26)$$

Then, G can be found using any of the existing linear equation system solvers. The difficulty lies in the ill-conditioned nature of the Hankel-structured coefficient matrix. Methods to overcome this are discussed hereinafter.

Step 3: Polynomial rooting of Equation (25).

This can be accomplished using a modified Newton's method or the Jenkins-Traub method to handle the multiple roots case. After all the roots are found, $\alpha$'s can be easily extracted from them through the relationship given in Equation (25). Pole management is performed here by accepting as distinct roots only those poles which are greater than a predetermined fraction of the used pixel size. This prevents noise spikes from appearing in the image. (See FIG. 2A, box 425, and FIG. 2B, box 550.)

(b) Determination of the local polynomial orders, P's:

After the $\alpha$'s are found, the P's can be determined based on the size of the local intervals. For example, if $\alpha_{l+1}-\alpha_l$ is on the order of $L\Delta f, \Delta f=1/N\Delta t$, it is reasonable to choose $P=Min(P_{max}, Max(0, L-1-1))$. Of course, the higher the local polynomial orders, the easier data consistency can be obtained.

(c) Determination of the local polynomial coefficients, C's:

After the P's and the $\alpha$'s are determined, the C's can be solved using a linear least squares procedure such as the Cholesky-decomposition-based or the Householder-transform-based method. If post-processing in step (a) is used to eliminate very narrow local regions, with respect to $1/\Delta t$, and the local polynomial orders are chosen based on the conventions in step (b), this linear least squares problem can be expected to be well-conditioned. Also, if the order of a certain local polynomial has been chosen to be too high in step (b), the coefficients will reflect this in that those not required will (at least ideally) be determined to be zero.

In practice, non-ideal conditions such as measurement noise and modeling error may limit the performance of this method, especially for the estimation of the non-linear parameters. It is known that the Hankel-structured data matrix A is usually ill-conditioned, therefore, its row space R (A) will be very sensitive to perturbation. Error in the estimation of the polynomial coefficients due to the rotation of R (A) can lead to very inaccurate estimation of the edge locations. In order for R (A) to be well-defined, it is suggested that q be chosen much larger than $M+\Sigma_l K_l$, and R (A) be approximated by the principal subspace of A, which can be obtained through singular value decomposition (SVD) of A. An order determination procedure is also used to reduce noise at the expense of some low energy components in the image.

If the subject model is described well by a predetermined condition number $\tau_L, \exists \lambda'/\lambda_L=\tau_L$, then $\tau$ is chosen as less than $\tau_L$. This can be determined by the model and/or system accuracy. Further, if $\lambda_{L'}^2 < \sigma^2$ (the noise variance), then $\tau < \tau_{L'}$. On the other hand, if M, the number of local regions, is not known a priori, the dimension of this principal subspace will give a good estimation of it. Further improvement can be obtained using combined forward and backward prediction to force the polynomial roots to lie on the unit circle in the complex plane. When the signal-to-noise ratio is very low and the number of data points N is small, the estimation bias for the non-linear parameters may be big even when SVD is used. In this case, it is preferred to use this approach to obtain an initial estimate and refine the result based on global least squares fitting. This can be accomplished by using a modified Newton's method with a proper line search scheme or the variable projection method.

A specific implementation of the method disclosed by this invention for reconstructing an image represented by a single or multi-dimensional object function (one consisting of steps, ramps, parabolas, and higher order models) is shown in FIG. 2b. The sampled data is input (box 500) and it is determined if the data is two-sided (box 505). If the data is one-sided and phase or other image constraints are available (box 510), the other side of the data will be created through a method such as projection onto convex sets (POCS) (box 515). (As described in Youla and Webb, "Image Restoration by the Method of Convex Projections: Part 1—Theory", *IEEE Trans. on Med. Imaging*, 2, 81–94, Oct., 1982; hereby incorporated herein by reference). In either case, the data is then filtered as dictated by the order of the model (box 520). Symmetric data (two-sided) is represented by either a forward or backward linear prediction formalism (box 525); data which is one-sided (other side could not be created in box 515) is represented by a combined forward and backward linear prediction formalism (box 530). An SVD is applied to the resulting coefficient matrix to improve the signal-to-noise ratio (box 535) and the order is estimated (box 540) to find the minimum $L^2$-norm solution of the polynomial coefficients (box 545). The model edge locations are then estimated by finding the roots of the polynomial (box 550). The signal-to-noise ratio (SNR) of the data is now estimated (box 555). If the SNR is sufficient, an iterative non-linear least squares technique, such as variable projection, is used to determine the edge locations (box 560). A linear least squares solution can then be determined to provide the model amplitudes (box 565), and an image is created (box 570) with magnitude and phase or the real and imaginary channels desired (box 575). The image is then transformed back to the data domain to determine whether it is consistent with the data (box 575). If the image is not consistent, the regions meeting predetermined model width and amplitude criteria are transformed back with more than the original number of data points, and the remaining image regions are recalculated with higher-order terms to force data consistency (box 580). A forward transform is then performed on the larger (extrapolated) data set with an FFT (box 585). The data-consistent high resolution image can now be output (box 590).

In order to demonstrate the performance of the proposed method, results from simulated data are presented below. The test models were built with selected features to emphasize the capability of this method for Gibbs free and high resolution reconstruction.

In FIG. 6, the model (FIG. 6A) consists of a combination of box car, ramp, and parabolic functions. Assume only 96 data points are available. The Fourier transform estimation in FIG. 6B exhibits an appreciable amount of Gibbs ringing. Using the proposed method with box car, ramp and parabolic functions being built into the model, an exact reconstruction, FIG. 6A, is obtained, as expected. If the model is purposely limited to contain only box-cars and ramps, FIG. 6C, or only box-cars, FIG. 6D, systematic modeling error will exist. However, as one can see, unlike Gibbs ringing, this error remains localized in the estimation. This is a powerful advantage. Furthermore, if Gaussian noise is added to the data, the estimation under the box-car model, FIG. 6E, is still very good as compared to the Fourier transform estimation. This indicates that the method is rather robust with respect to either systematic modeling error or random noise of moderate level.

Further improvement of the reconstruction may be achievable by incorporating constraints, such as data consistency, positivity, phase (as would be required with one-sided data), noise statistics, and others including a maximum entropy method. The closer the constraints reflect actual characteristics of the image, the better the reconstruction will be, but the underlying optimization becomes more complicated. However, if the constraints can be formulated as closed convex sets in the Hilbert space, as is the case with the above constraints, the constrained optimization problem can easily be solved using the projection onto a convex set formalism (POCS).

For example, if the signal-to-noise ratio is low, the constrained reconstruction $\hat{\rho}(x)$ may be poor. In such a case it may be necessary to reinforce the data consistency constraint to pick up the subtle image features. This can be accomplished by iteratively mapping $\hat{\rho}(x)$ back into the data domain and replacing the inconsistent data with the known data, and then re-transforming the data back to the image domain to get a new reconstruction $\bar{\rho}(x)$. Now $\bar{\rho}(x)$ is data consistent, but it is not consistent with $\hat{\rho}(x)$. Considering that $\hat{\rho}(x)$ usually contains good edge information (at least for prominent edges), it is important to retain them for Gibbs ringing reduction. Then to make $\bar{\rho}(x)$ consistent with $\hat{\rho}(x)$, $\hat{\rho}(x)$ can be relaxed with respect to certain higher order terms. No more than N new terms (N is the number of data points) are needed to make $\bar{\rho}(x)$ be data consistent. However, to avoid the higher order terms contributing too much noise, they may be introduced to only those local intervals where $\bar{\rho}(x)$ is large in magnitude and the interval is large with respect to $\Delta x$. Additionally, for each iteration the number of new terms introduced should be much smaller than N. After a few iterations, $\bar{\rho}(x)$ will be consistent with known data and the reconstruction can be obtained from the extrapolated data. The higher the signal-to-noise ratio, the further the data can be extrapolated to produce a higher resolution image.

Once an initial estimate is available other reconstruction schemes such as the variable projection reconstruction (See Golub, Siam Journal of Numerical Analysis, Vol. 10, p. 413 (1973), which is hereby incorporated herein by reference) or state space approaches could be used to further improve image resolution and signal-to-noise. Further, more general shapes without sharp edges or non-polynomial in nature can now be included in the iterative scheme as described in copending application Ser. No. 193,418. This approach may be optimal when a different sampling scheme is chosen to enhance certain features in the image. Specifically, sampling at the spatial frequency (frequencies) of interest sufficient to avoid aliasing can be chosen. Further, after an initial estimate in one dimension is completed, the second dimension can be analyzed in the same manner. At this point a continued iteration between directions can be performed. Then a full two-dimensional iterative matrix solution can be performed to further enhance signal-to-noise and resolution.

As will be appreciated by those having ordinary skill in the art upon a reading and understanding of the foregoing description, Fourier transform-like data sampled from a magnetic resonance imaging unit can be reconstructed in accordance with the invention as to allow superresolution and improved signal-to-noise. The discretely sampled data is used to reconstruct an object with certain assumed shapes. The amount of a priori knowledge, if less than the number of sample points, can be used to determine the parameters characterizing the object. In this sense, an exact determination of the model parameters gives the unlimited or superresolution. Similarly knowing the model parameters allows the classification or pattern recognition of the image contents. Careful analysis of the data can also lead to an improvement of signal-to-noise over conventional Fourier analysis. Both the limited resolution and poor signal-to-noise of the Fourier transform method with only n sample points can thus be overcome. The parameter estimation provides for pattern recognition and automatic edge detection and as such is applicable to many imaging modalities. The concept of incorporating the object into the kernel and solving for the object's location can be extended with all the above ramifications to any general transform.

The apparatus and method of the invention provide one or more of the following advantages: (1) superresolution-no aperture limited pixel size in that the edges (or parameters in general) can be accurately determined independent of the number of data points collected when no noise is present; (2) edge detection-parameters representing edges can be accurately determined; (3) pattern recognition-automatic recognition of shapes through their parameters; (4) improvement in signal-to-noise of the image through the reduction of the number of parameters used to describe the data; (5) data compression-the smaller number of parameters saves on required memory for storage of transformed image data; (6) application to half-Fourier data reconstruction to save time by another factor of two; (7) wide application to Fourier transform data as well as other well behaved image transformed data; (8) optimal sampling to enhance resolution and signal-to-noise; (9) application to one-dimensional or n-dimensional data; and (10) extension to non-Fourier transform data.

As above described, the transform means may be included as an integral part of an NMR imaging unit. It also is noted that the transform means may be employed as a separate unit in the form of an appropriately programmed computer or processor with suitable data storage means and coupling to an image display means. Accordingly, the unit may be employed as an auxiliary device coupled by suitable means to an existing NMR scan unit for providing a second data reconstruction mode independent of that already embodied in the NMR unit for increased flexibility. The auxiliary unit may be coupled so as to receive the discretely sampled magnetic resonance image data for analysis in accordance with the invention. In addition, data may be processed in parallel to significantly decrease reconstruction time.

Although the invention has been shown and described with respect to a preferred embodiment, it is obvious that equivalent alterations and modifications will occur to others skilled in the art upon the reading and understanding of this specification. The present invention includes all such equivalent alterations and modifications, and is limited only by the scope of the following claims.

What is claimed is:

1. A method for magnetic resonance imaging of an object using scan data obtained with a nuclear magnetic resonance scanner, said method comprising the steps of:
   (a) acquiring nuclear magnetic resonance scan data of an object; and
   (b) transforming the scan data from data space to image space using a series of modeling functions, including at least one predefined non-point modeling function, approximating the object to be imaged, and wherein the transforming step includes solving the data space representation of an object function characterized by such series of modeling functions; and
   (c) displaying the image data in man-readable form.

2. A method as set forth in claim 1, wherein said modeling function is a one-dimensional step function.

3. A method as set forth in claim 1, wherein said modeling function is a polynomial function.

4. A method as set forth in claim 1, wherein said modeling function is a non-polynomial function.

5. A method as set forth in claim 1, wherein said solving step includes using a least squares fitting technique to determine model function amplitudes.

6. A method as set forth in claim 1, wherein said solving step includes using singular value decomposition in the determination of model function centers and durations to improve signal-to-noise.

7. A method as set forth in claim 1, wherein said transforming step includes using a least squares fitting technique to determine all model parameters.

8. A method as set forth in claim 1, wherein said transforming step includes using singular value decomposition.

9. A method as set forth in claim 1, including the steps of analytically Fourier transforming the selected image space data back to data space to obtain an extended set of simulated data points over a region greater than the region of the acquired scan data, then forming an enhanced data set by replacing the region of the simulated data corresponding to the acquired scan data with the acquired scan data while maintaining the remainder of the simulated data, and then transforming the enhanced data set from data space to image space as the reconstruction of the image.

10. A method as set forth in claim 9, wherein the image space data being transformed back to data space is selected to retain consistency of original data and allow further image improvement through higher order modeling.

11. A method as set forth in claim 9, wherein image space data being transformed back to data space is selected to be representative of a region of the image giving significant contribution to the data space.

12. A method of processing image data comprising the steps of:
   (a) acquiring discretely sampled object data for the first space; and
   (b) transforming the discretely sampled first space data into a second space using a series of modeling functions, including at least one predefined non-point modeling function approximating the imaged object, and wherein the transforming step includes solving the data space representation of an object function characterized by such series of modeling functions.

13. A method as set forth in claim 12, including the step of locating functional changes in form.

14. A method as set forth in claim 13, wherein said functional changes in form include image edges.

15. A method as set forth in claim 13, wherein said step of locating functional changes in form includes high-pass filtering the data prior to reconstruction.

16. A method as set forth in claim 13, wherein said step locating functional changes in form includes applying a singular value decomposition technique to the data.

17. A method as set forth in claim 12, including the step of iteratively using a non-linear least squares fitting technique to increase the signal-to-noise ratio of the data.

18. A method as set forth in claim 12, including the step of iteratively using a non-linear least squares fitting technique to fit non-polynomial model shapes.

19. A method as set forth in claim 12, including the step of iteratively using a non-linear least squares fitting technique to fit model shapes in one or more dimensions.

20. A method as set forth in claim 12, including the step of using a linear least squares fitting technique to determine model amplitudes.

21. A method as set forth in claim 13, wherein the determined changes in functional form are used to classify or pattern recognize shapes in the image.

22. A method as set forth in claim 21, wherein the said changes in functional form include image edges.

23. A method as set forth in claim 21, wherein the classified or pattern recognized shapes are represented as delta functions, step-functions or polynomial functions, or a combination thereof.

24. An imaging apparatus for reconstructing an image from scan data obtained with an NMR scanner, said apparatus comprising:
   (a) acquisition means for acquiring nuclear magnetic resonance scan data of an object;

(b) transform means using the data representation of at least one known non-point shape, in one or more dimensions, as a constraint for reconstructing an image from scan data; and (c) a display means for displaying the reconstructed image in man-readable form.

25. An apparatus as set forth in claim 24, wherein one-dimensional data is transformed.

26. An apparatus as set forth in claim 24, wherein two or more dimensional data is transformed.

27. An imaging apparatus for reconstructing an image from Fourier transform data comprising:

(a) means for sampling Fourier transform data in at least one dimension;

(b) means for representing said Fourier transform data by a series of modeling functions, including at least one predefined non-point modeling function, approximating the image; and (c) transform means for reconstructing the image by solving the data space representation of an object function characterized by such series of modeling functions.

28. An apparatus as set forth in claim 27, wherein said sampling means includes means for sampling nuclear magnetic resonance image data.

29. The method of claim 1, wherein said predefined non-point modeling function has a variable duration, center and amplitude.

30. The method of claim 12, wherein said predefined non-point modeling function has a variable duration, center and amplitude.

31. The apparatus of claim 24, wherein said known non-point shape has a variable duration, center and amplitude.

32. An imaging method for mapping first space object data into a second space, comprising the steps of:

(a) acquiring discretely sampled object data for the first space; and (b) using a series of modeling functions including one or more predefined non-point modeling functions by which the object to be imaged is represented in the second space to transform the discretely sampled first space object data into the second space.

33. A method as set forth in claim 32, including the step of using sets of uniformly sampled object data.

34. A method as set forth in claim 32, wherein said acquiring step includes acquiring discretely sampled nuclear magnetic resonance image data.

35. A method as set forth in claim 32, wherein said acquiring step includes acquiring discretely sampled computerized tomography image data.

36. A method as set forth in claim 32, including the steps of filtering the acquired sampled object data and then determining edges or changes in functional form.

37. A method as set forth in claim 36, wherein said filtering step includes differentiating the sampled object data.

38. A method as set forth in claim 36, wherein said filtering step includes filtering n-dimensional data using a set of direction derivatives.

39. A method as set forth in claim 36, wherein the determined edges or changes in functional form are used to classify or pattern recognize the objects in the image.

* * * * *